(12) United States Patent
Noll

(10) Patent No.: US 9,913,426 B2
(45) Date of Patent: Mar. 13, 2018

(54) CONTROL SENSOR ASSEMBLY FOR AN AGRICULTURAL HARVESTER

(71) Applicant: CNH Industrial America LLC, New Holland, PA (US)

(72) Inventor: Blaine Noll, Fleetwood, PA (US)

(73) Assignee: CNH Industrial America LLC, New Holland, PA (US)

( * ) Notice: Subject to any disclaimer, the term of this patent is extended or adjusted under 35 U.S.C. 154(b) by 0 days.

(21) Appl. No.: 14/870,808

(22) Filed: Sep. 30, 2015

(65) Prior Publication Data

US 2017/0086366 A1 Mar. 30, 2017

(51) Int. Cl.

| | |
|---|---|
| *A01D 41/14* | (2006.01) |
| *G01D 5/06* | (2006.01) |
| *A01D 34/00* | (2006.01) |
| *G01R 33/06* | (2006.01) |
| *G01D 5/14* | (2006.01) |
| *G01D 11/30* | (2006.01) |
| *A01D 101/00* | (2006.01) |

(52) U.S. Cl.
CPC ........... *A01D 34/008* (2013.01); *G01D 5/145* (2013.01); *G01D 11/30* (2013.01); *G01R 33/06* (2013.01); *A01D 2101/00* (2013.01)

(58) Field of Classification Search
CPC .... A01D 34/00; A01D 34/006; A01D 41/141; A01D 2101/00; A01D 34/008; G01R 15/202; G01R 15/205; G01R 19/0092; G01R 33/06; G01D 5/12; G01D 5/145
USPC ................. 324/207.25, 207.21, 207.11, 259; 56/10.2 E See application file for complete search history.

(56) References Cited

U.S. PATENT DOCUMENTS

| | | |
|---|---|---|
| 4,171,606 A | 10/1979 | Ziegler et al. |
| 4,332,126 A | 6/1982 | Van Auwelaer et al. |
| 4,414,793 A | 11/1983 | Halls |
| 4,567,719 A | 2/1986 | Soots et al. |
| 4,641,490 A | 2/1987 | Wynn et al. |

(Continued)

FOREIGN PATENT DOCUMENTS

| | | |
|---|---|---|
| CA | 2120169 A1 | 2/1995 |
| DE | 102009030955 A1 | 1/2010 |

OTHER PUBLICATIONS

EP16191258, Extended European Search Report, dated Feb. 24, 2017, 7 pages.

*Primary Examiner* — John Weiss
(74) *Attorney, Agent, or Firm* — Peter K. Zacharias; Patrick M. Sheldrake

(57) ABSTRACT

A control sensor assembly for an agricultural harvester is provided. The control sensor assembly includes a linkage for connection to a header height control system, a bushing, a mount and a sensor mounted to the mount. The bushing includes a first end connected to the linkage and a second end housing a magnet. The mount includes a body having a through hole extending from a first surface to a second surface opposite the first surface for receiving the bushing and a first rotational stop about the first surface and adjacent the through hole. The sensor is spaced from the second end of the bushing. The control sensor assembly according to the subject application is designed to provide an improved mount for the control sensor assembly that utilizes a single mount to perform multiple functions.

18 Claims, 11 Drawing Sheets

(56) References Cited

U.S. PATENT DOCUMENTS

| | | | |
|---|---|---|---|
| 6,202,395 B1* | 3/2001 | Gramm | A01D 41/141 |
| | | | 172/4 |
| 6,378,620 B1 | 4/2002 | Luca et al. | |
| 7,222,474 B2 | 5/2007 | Rayfield et al. | |
| 7,230,419 B2* | 6/2007 | Godoy | G01D 11/245 |
| | | | 324/207.2 |
| 7,950,212 B1 | 5/2011 | Figgins et al. | |
| 8,146,335 B2* | 4/2012 | Vandeven | A01D 41/141 |
| | | | 56/10.2 E |
| 8,201,388 B1 | 6/2012 | Vandeven et al. | |
| 2014/0084908 A1* | 3/2014 | Kaiser | G01D 11/245 |
| | | | 324/207.25 |
| 2016/0007531 A1* | 1/2016 | Schlipf | A01D 41/141 |
| | | | 56/10.2 E |

\* cited by examiner

CONTROL SENSOR ASSEMBLY FOR AN AGRICULTURAL HARVESTER

BACKGROUND

The subject application relates generally to a control sensor assembly for an agricultural harvester. In particular, the subject application provides an improved mount for the control sensor assembly that utilizes a single mount to perform multiple functions.

During a harvesting operation, a header at the front of a harvester cuts ripened crops from the field. The header is attached to the front of the harvester and includes mechanisms, for example, for cutting crops, gathering crops and depositing crops into a feederhouse. The objective of the agricultural harvester is to gather as much crop material as possible when traveling across the field. This can become increasingly difficult as the ground contour can vary. As a result, header height control systems are utilized to raise, lower and tilt the header in order to maximize the harvester's crop yield.

Generally, a header height control system utilizes a control sensor assembly to accurately detect the contour of the ground for changes in landscape i.e., its position relative to the ground as it travels over uneven terrain. Conventional control sensor assemblies require the use of multiple sensors and parts which consequently requires a larger number of steps and complexity in the installation process. During installation, operators have to ensure that the control sensor assembly is properly oriented for connection to the header height control system. If assembly and installation is done incorrectly, this could lead to increased delays and maintenance costs, improper operation of the harvester, economic loss, as well as damage to components of the agricultural harvester.

Therefore, there is still a need for an improved mount for a control sensor assembly that reduces potential for human error and performs multiple functions with less assembly parts and requires fewer steps to install the assembly. The subject application addresses the foregoing issues of conventional control sensor assemblies.

BRIEF SUMMARY

In accordance with an aspect, the subject application provides a control sensor assembly for an agricultural harvester. The control sensor assembly comprises a linkage, a bushing, a mount and a sensor. The linkage is for connection to a header height control system. The bushing includes a first end connected to the linkage and a second end housing a magnet. The mount includes a body having a through hole extending from a first surface to a second surface opposite the first surface for receiving the bushing and a first rotational stop about the first surface and adjacent the through hole. The sensor is mounted to the mount and spaced from the second end of the bushing.

In accordance with another aspect, the subject application provides a header of an agricultural harvester. The header comprises a frame, a linkage and a control sensor assembly mounted to the frame. The control sensor assembly includes a bushing, a mount and a sensor. The bushing includes a first end connected to the linkage and a second end housing a magnet. The mount includes a body having a through hole extending from a first surface to a second surface opposite the first surface for receiving the bushing and a first rotational stop about the first surface and adjacent the through hole. The sensor is mounted to the mount and spaced from the second end of the bushing.

In accordance with yet another aspect, the subject application provides a mount for mounting a sensor to a header of an agricultural harvester. The mount comprises a body and first and second spaced apart guide surfaces. The body includes a counterbore and a through hole extending through the counterbore from a first surface of the body to a second surface of the body opposite the first surface. The body further includes an anterior surface adjacent the counterbore and extending substantially transverse to the first surface. The first and second spaced apart guide surfaces extend from the first surface. Each guide surface is positioned adjacent a lateral side of the counterbore and the first guide surface includes an engaging surface at an angle relative to an engaging surface of the second guide surface. The first and second guide surfaces each have a mounting surface and an opening through which a fastener is passable for securing the mount to the header. The mounting surface is substantially parallel to and spaced from the first surface for engaging the header.

The subject application provides a unique mount for a non-contact header height control sensor that uses one piece to perform multiple functions. The main block will control shaft end-play, act as a rotational stop, serve as the sensor mount, and mount the entire system to a machine that is using header height control (HHC). A non-contact sensor is a sensor in which the magnet is a separate piece from the sensor body itself unlike a one piece sensor in which everything is contained within the sensor body. The non-contact sensor needs to maintain a specified air gap between the magnet and the sensor body for proper functionality. Thus, a system is needed to control the end play of the magnet that is attached to the rotating shaft and consistently hold the sensor body at the appropriate location. Along with the end play, the rotational motion needs a bearing surface to allow free rotation of the shaft. The system also needs a rotational stop so that during assembly it cannot be assembled incorrectly. The system is also simpler than what is currently used. It has fewer parts and would be used multiple times in comparison to once per header.

Conventional header height control systems consist of a laser formed piece with two machined hubs welded to it, two bushings pressed into each hub, and two snap rings. The assembly is for one side of the machine and would have a mirror image on the opposite side. The parts in the disclosed system of the subject application would be a machined block and a plastic bearing surface. The subject application's assembly can be used multiple times e.g., four times, on the header whereas the current system has a left and right and is only used once per head.

In the subject application, the main block of the system is machined so that from the face of one side to the other side, the distance will be consistent allowing the air gap between the magnet and the sensor body to be precisely controlled. Additionally, the machined rotational stops will automatically be formed into the block. The rotational stops will help with the installation by forcing the installer to properly orient the block with respect to the side of the machine, since this single block will be able to be used in multiple locations on the machine. The plastic bearing surface will also hold multiple functions. On one side of the plastic part, there will be a machined spot for the magnet to be attached to. The opposite end will have another machine feature that will act as a receiver that will accept a driver feature on the header height control linkage. This all can be assembled first and then assembled to the machine. The machine will act as the stop that does not allow the magnet to get farther away from the sensor.

In addition to controlling the air gap, the resultant advantages of the subject application include having fewer parts that need to be maintained. In conventional header height control systems, the auger and draper head use different parts that perform the same function along with needing a left and right portion which means four separate assembly part numbers, not including sub parts that go into the assembly. The subject application would allow for the same assembly parts to be used on both heads for the left and right sides, reducing four separate assembly part numbers to one. The subject application's system would require fewer processes to make the assembly than currently is required. Conventional header height control systems require a laser process, forming process, machining process, welding process and painting while the subject application would only need a machining process or a molding process (for a plastic mount) to manufacture the mount. The built in stops will require the assembler to only assemble the subject application in the correct way. The current system is mounted using two bolts which would allow the operator to incorrectly assemble it if they were not paying attention.

In sum, the subject application provides an improved mount for a non-contact header height control sensor that performs multiple functions including controlling shaft endplay, acting as a rotational stop, serving as a sensor mount, and mounting the entire system to the machine that is using header height control. The resultant advantages of such a mount are that one single part is performing multiple tasks while controlling the air gap needed for the two piece sensor.

BRIEF DESCRIPTION OF THE SEVERAL VIEWS OF THE DRAWINGS

The foregoing summary, as well as the following detailed description of the several aspects of the subject application, will be better understood when read in conjunction with the appended drawings. For the purpose of illustrating the subject application, there are shown in the drawings several aspects, but it should be understood that the subject application is not limited to the precise arrangements and instrumentalities shown.

In the drawings.

DETAILED DESCRIPTION

Reference will now be made in detail to the various aspects of the subject application illustrated in the accompanying drawings. Wherever possible, the same or like reference numbers will be used throughout the drawings to refer to the same or like features. It should be noted that the drawings are in simplified form and are not drawn to precise scale. In reference to the disclosure herein, for purposes of convenience and clarity only, directional terms such as top, bottom, left, right, above, below and diagonal, are used with respect to the accompanying drawings. Such directional terms used in conjunction with the following description of the drawings should not be construed to limit the scope of the subject application in any manner not explicitly set forth. Additionally, the term "a," as used in the specification, means "at least one." The terminology includes the words above specifically mentioned, derivatives thereof, and words of similar import.

"About" as used herein when referring to a measurable value such as an amount, a temporal duration, and the like, is meant to encompass variations of ±20%, ±10%, ±5%, ±1%, or ±0.1% from the specified value, as such variations are appropriate.

Figure 1:
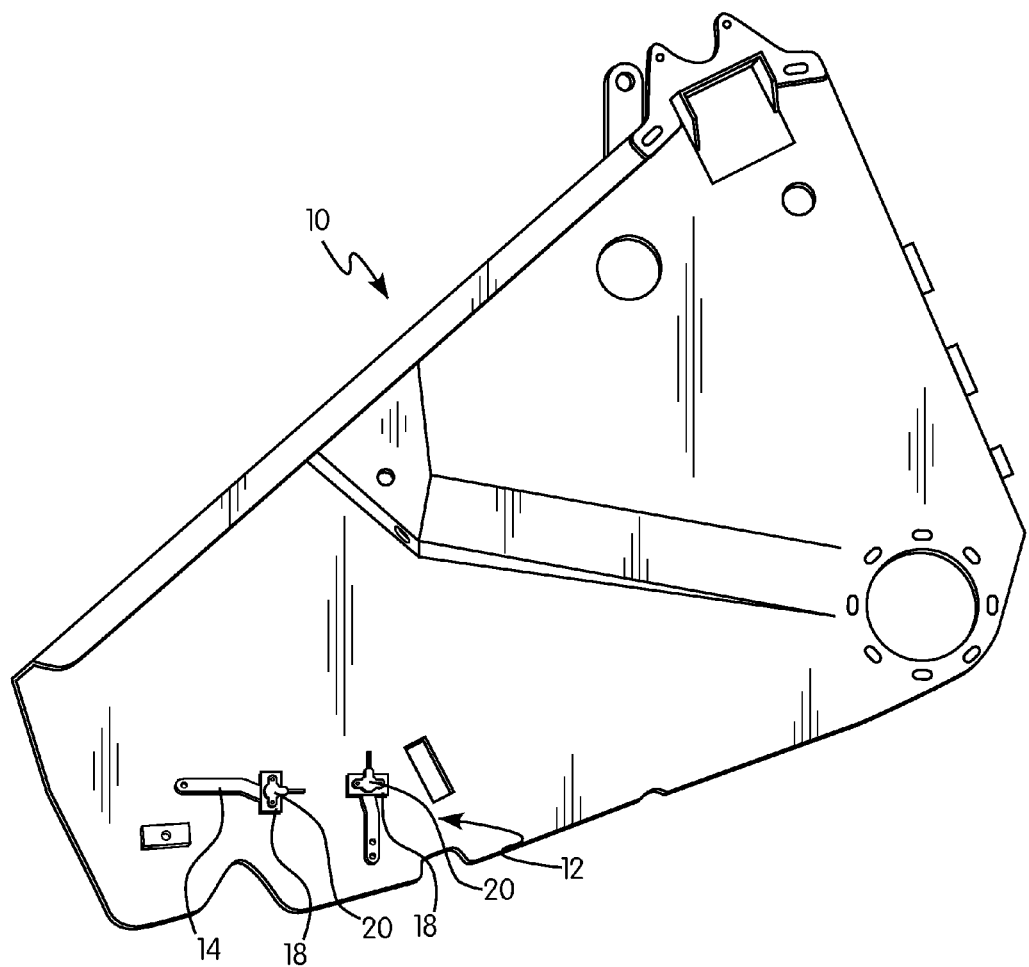
FIG. 1 is a side view of a frame of a header of an agricultural harvester in accordance with an aspect of the subject application.

Referring now to the drawings, wherein aspects of the subject application are shown, FIG. 1 illustrates several features of a frame of a header of an agricultural harvester according to the subject application. For purposes of illustration only and not by way of limitation, the header will be described e.g., as a header with a flexible cutter bar assembly, but can alternatively be any other header having a height control sensor. In addition to the frame, the header includes mechanisms for cutting crops, gathering crops and delivering crops to the agricultural harvester and is positioned relative to a ground surface upon which the agricultural harvester travels.

In FIG. 1, there is shown a control sensor assembly 12 mounted to a side of a frame 10 of a header which can be attached to the front or anterior end of a combine or similar agricultural harvester (not shown). The frame 10 serves generally as a chassis for the header for supporting the various components of the header which are attached thereto. The header can include, among other components, a cutter bar. Such components of the header are known and therefore a detailed description of their structure, function and operation is not necessary for a complete understanding of the subject application. However, headers applicable to the subject application are disclosed in U.S. Pat. Nos. 7,950,212; 7,222,474; and 4,414,793, the entire disclosures of which are incorporated by reference herein for all purposes.

The cutter bar severs crops as the header of the agricultural harvester travels over the field. The crops are then conveyed towards other downstream components of the agricultural harvester, e.g., auger or feeder (not shown). During operation, the cutter bar is designed to have flexibility in order to accommodate and conform generally to changing ground contours at different locations of the field. As a result, a reliable ground sensor is required to serve as indicators of ground contour changes to adjust the height position of the header and its components.

A control sensor assembly 12 is configured and operable according to the teachings of the subject application, for following and sensing ground contour changes and outputting signals representative thereof to a header height control system 11 (FIG. 10) of an agricultural harvester. The control sensor assembly 12 allows the header height control system 11 to raise or lower the header as required for maintaining the cutter bar at a desired level above the ground.

Figure 9:
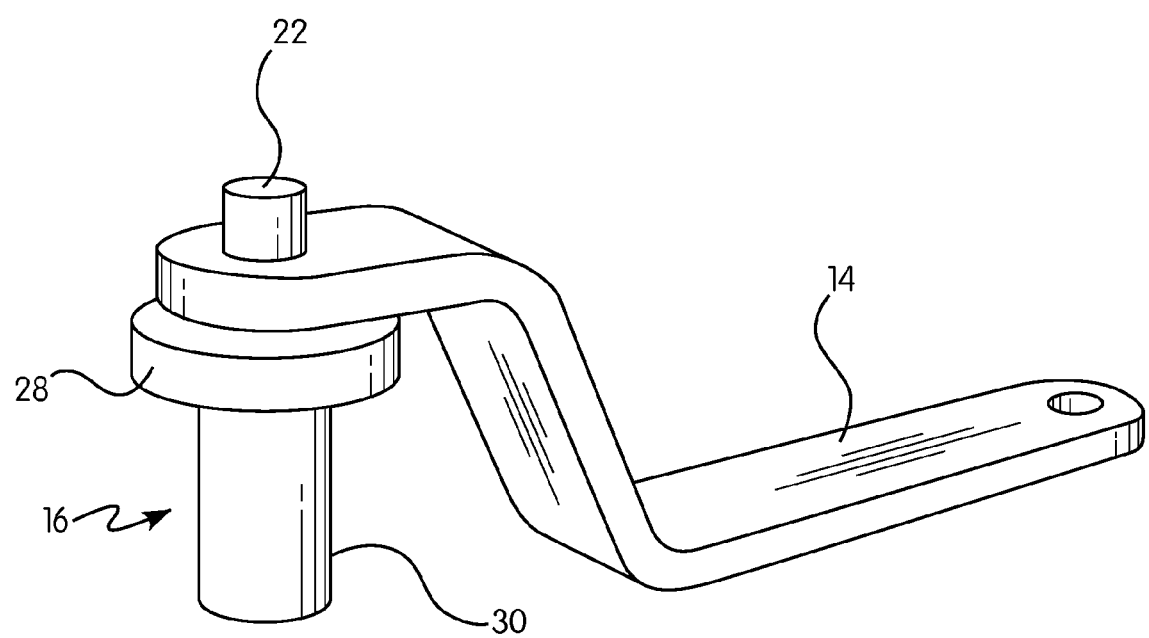
FIG. 9 is a perspective view of a linkage and bushing of the control sensor assembly of FIG. 2.

Referring now to FIGS. 2-5, there is shown a preferred embodiment of the control sensor assembly 12 in accordance with the subject application. The control sensor assembly 12 includes a linkage 14, a bushing 16, a mount 18 and a sensor 20. The linkage 14 connects the control sensor assembly 12 to the header height control system 11 in a conventional, well-known manner in the art. In accordance with an aspect, the linkage 14 has a proximal end with an aperture configured to receive a shaft 22 connecting the linkage to the bushing 16. Preferably, the shaft 22 has a circular shaped first end corresponding to the aperture of the linkage 14 and an angular shaped second end e.g., a parallel piped shaft, opposite the first end. The angular shape of the second end corresponds to a slot 24 in the bushing 16 for connecting the linkage 14 and bushing 16. As such, owing to the corresponding fit between the angular shaped second end and the female end of the bushing, the bushing will rotate correspondingly with rotation of the linkage about an axis defined by the shaft 22. The linkage 14 also has a distal end with an aperture for adjustably connecting the linkage to the header height control system. FIG. 9 shows an isolated perspective view of the shaft 22 connecting the linkage 14 to the bushing 16.

Figure 2:
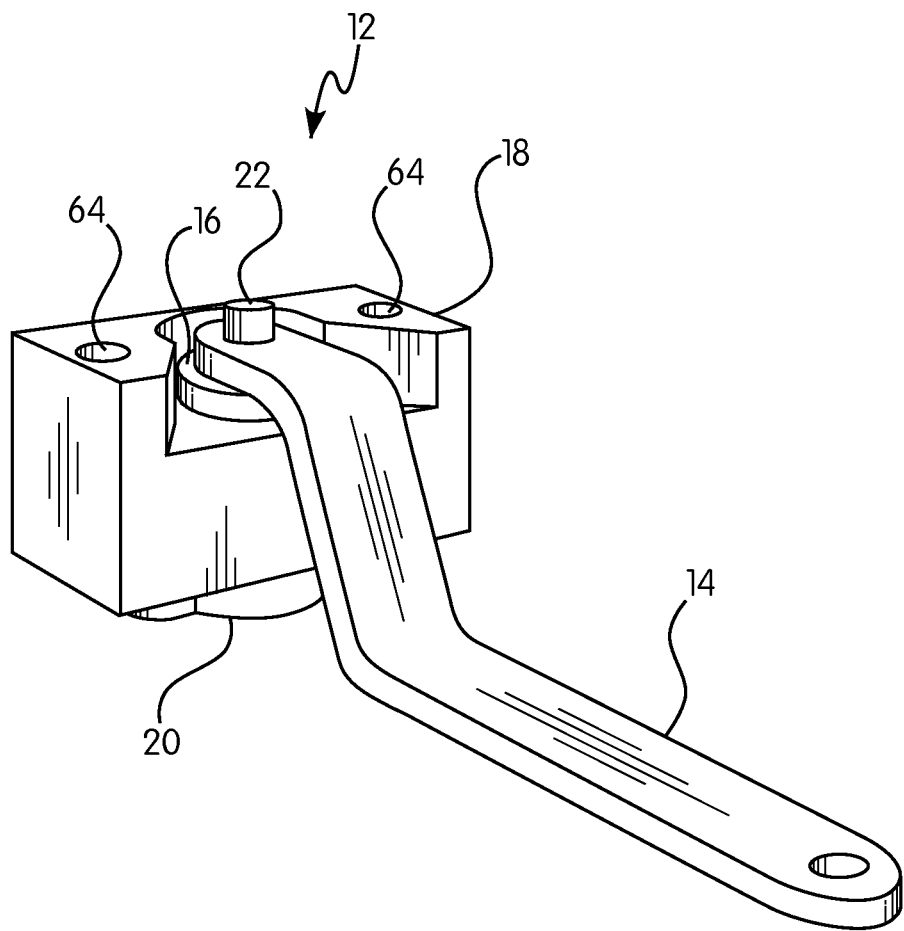
FIG. 2 is a bottom, front perspective view of a control sensor assembly in accordance with an aspect of the subject application.
Figure 3:
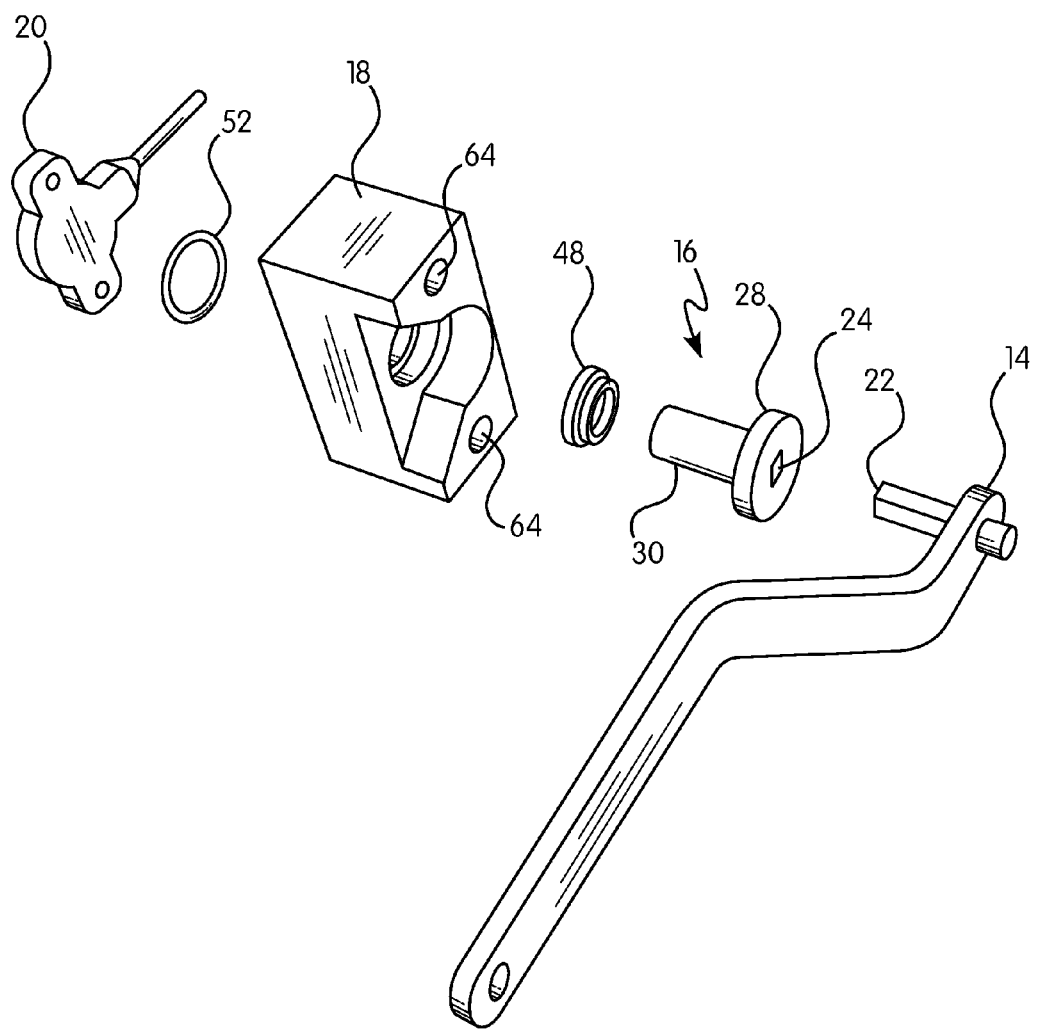
FIG. 3 is an exploded bottom perspective view of the control sensor assembly of FIG. 2.
Figure 4:
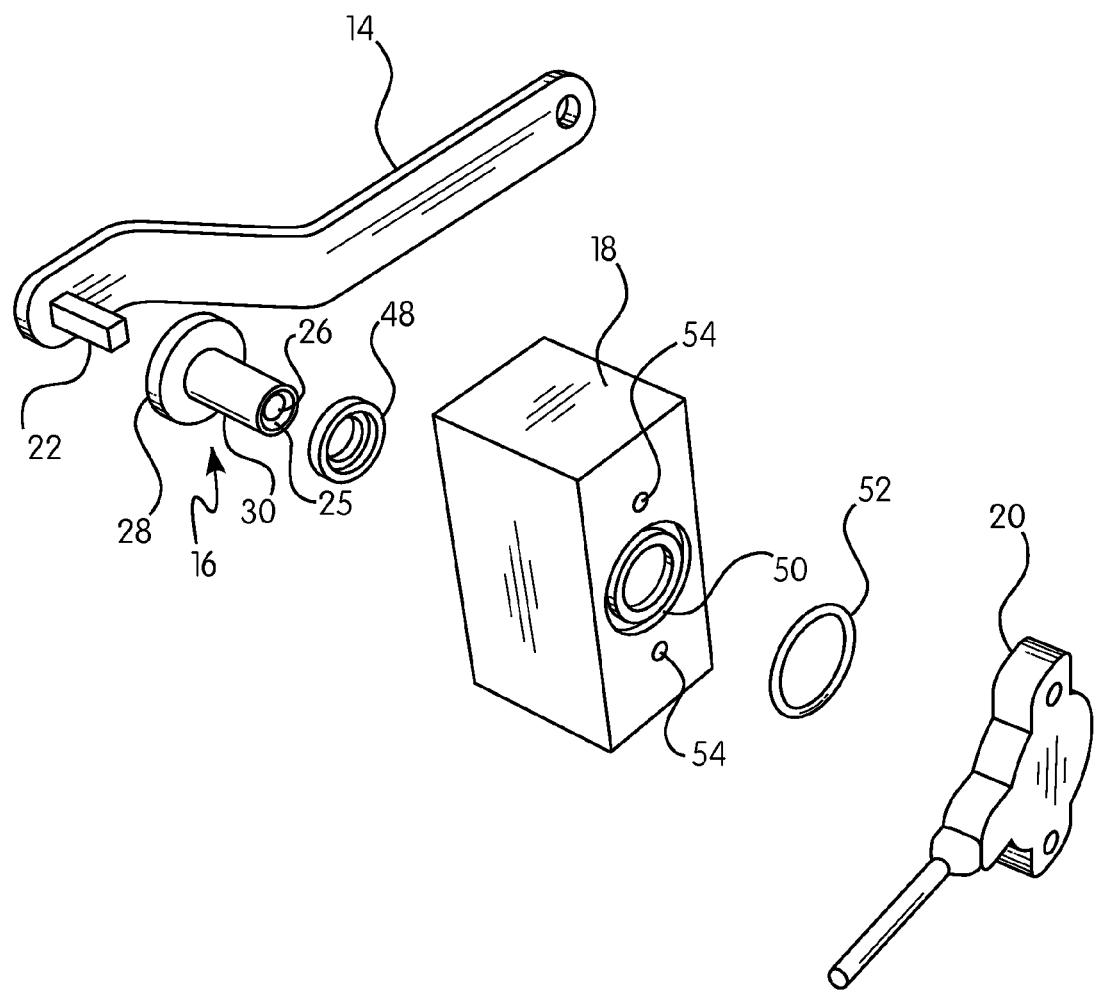
FIG. 4 is an exploded top perspective view of the control sensor assembly of FIG. 2.

As best shown in FIGS. 2-4, the bushing 16 includes a first end connected to the linkage 14 and a second end housing a magnet 26. In accordance with an aspect, the bushing 16 is preferably configured as a flanged bushing with a flange member 28 and a stem 30 extending from the flange member. The stem 30 is preferably configured as an elongated cylindrical member. The flange member 28 has a diameter larger than that of the stem 30. As previously discussed, the flange member 28 at the first end of the bushing 16 can include a slot 24 for receiving the angular end of the shaft 22 in order to connect the proximal end of the linkage to the bushing 16. Alternatively, the slot 24 and the angular end of the shaft 22 can be configured with any other shape suitable for its intended purpose, such as a shaft having a longitudinal cross section of a square, triangle, and the like. In accordance with another aspect, the linkage 14 and the bushing 16 can alternatively be connected with suitable fasteners, e.g. pins, screws, bolts, and the like.

In accordance with an aspect, the second end of the bushing 16 includes a cavity 25 for housing a magnet 26 of a non-contact magnetic sensor, as further discussed below. As shown in FIG. 4, the cavity 25 about a second end of the bushing 16 is preferably shaped to correspondingly receive and fixedly hold the magnet 26. Specifically, the magnet 26 is fixedly mounted to the bushing 16 allowing it to rotate as the bushing rotates. As further discussed below, the rotational movement of the magnet 26 with respect to the sensor 20 results in an output signal representative of a positional relationship between the header and the ground.

Figure 6:
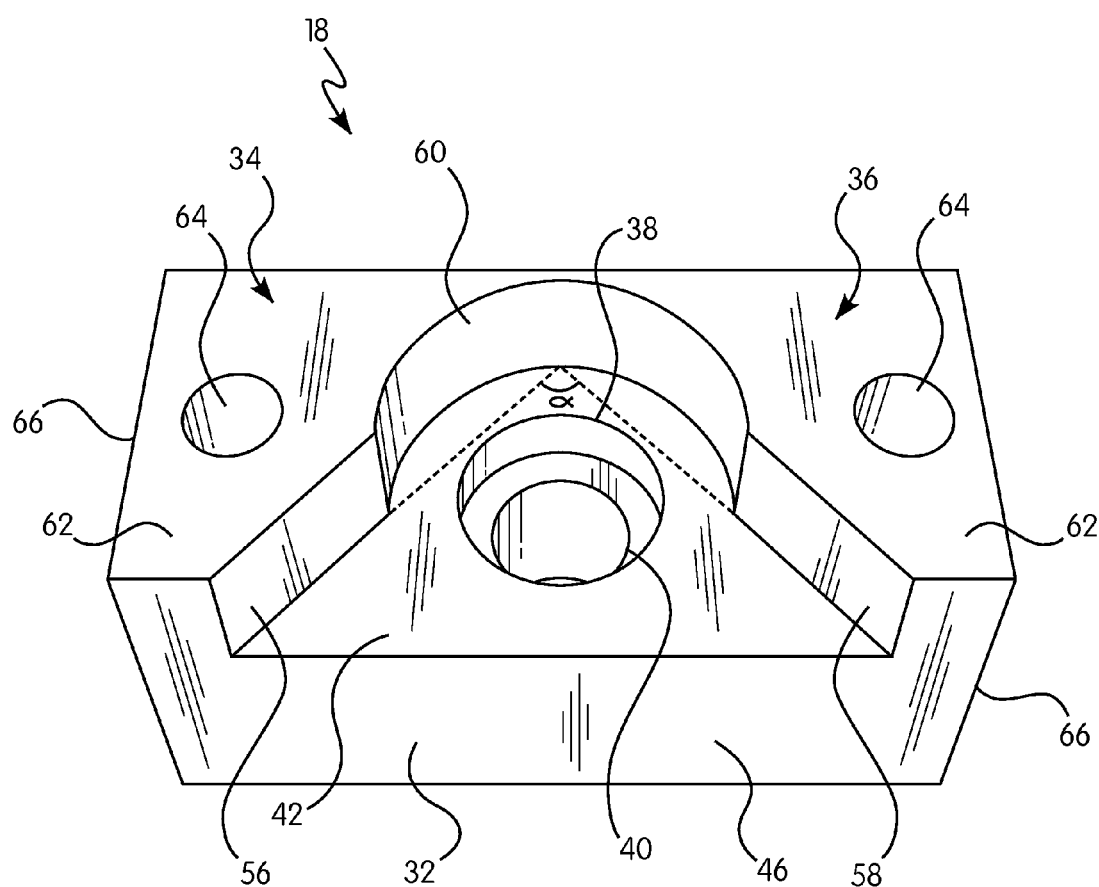
FIG. 6 is a bottom, front perspective view of a mount of the control sensor assembly of FIG. 2.
Figure 7:
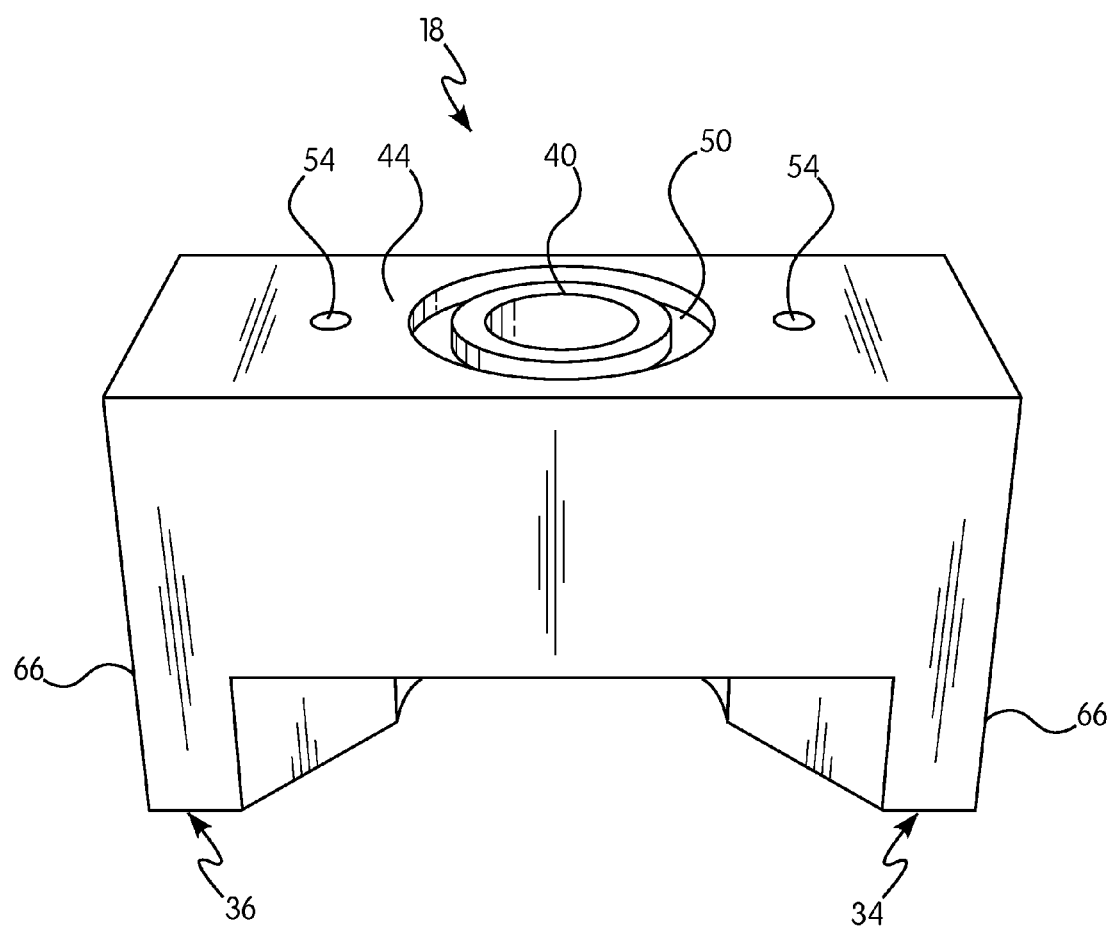
FIG. 7 is a top perspective view of the mount of FIG. 6.
Figure 8:
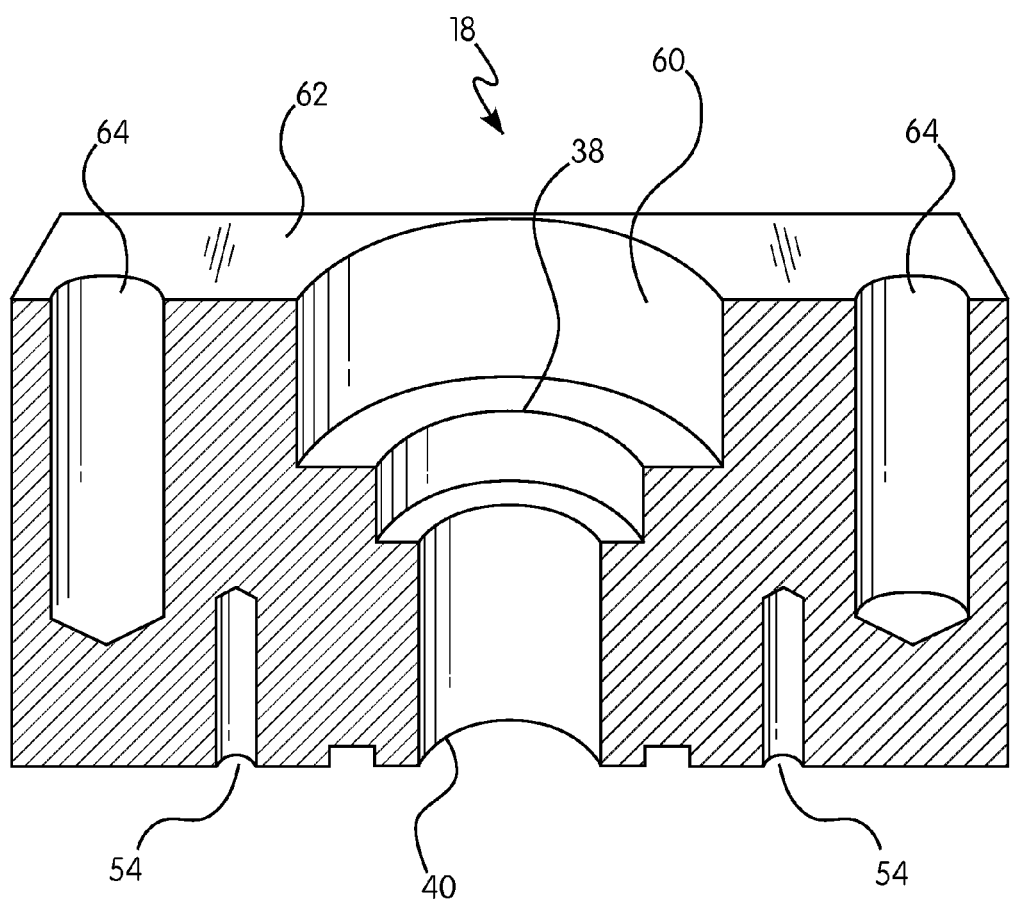
FIG. 8 is a coronal cross sectional view of the mount of FIG. 6.

As best shown in FIGS. 6-8, the mount 18 includes a body 32 and spaced apart first and second rotational stops 34, 36. Preferably, the mount 18 is configured as a block for operatively connecting to a flexible cutter bar system. As further discussed below, the block can be appropriately modified such that the control sensor assembly 12 is applicable to different types of headers, e.g., corn header, auger, draper and the like.

The body 32 includes a counterbore 38 and a through hole 40 extending through the counterbore 38. The through hole 40 extends from a first surface 42 of the body to a second surface 44 of the body opposite the first surface and has a central longitudinal axis substantially transverse to a plane of the first surface 42. The body further includes an anterior surface 46 adjacent the counterbore 38 and extending substantially transverse to the first surface 42.

Figure 5A:
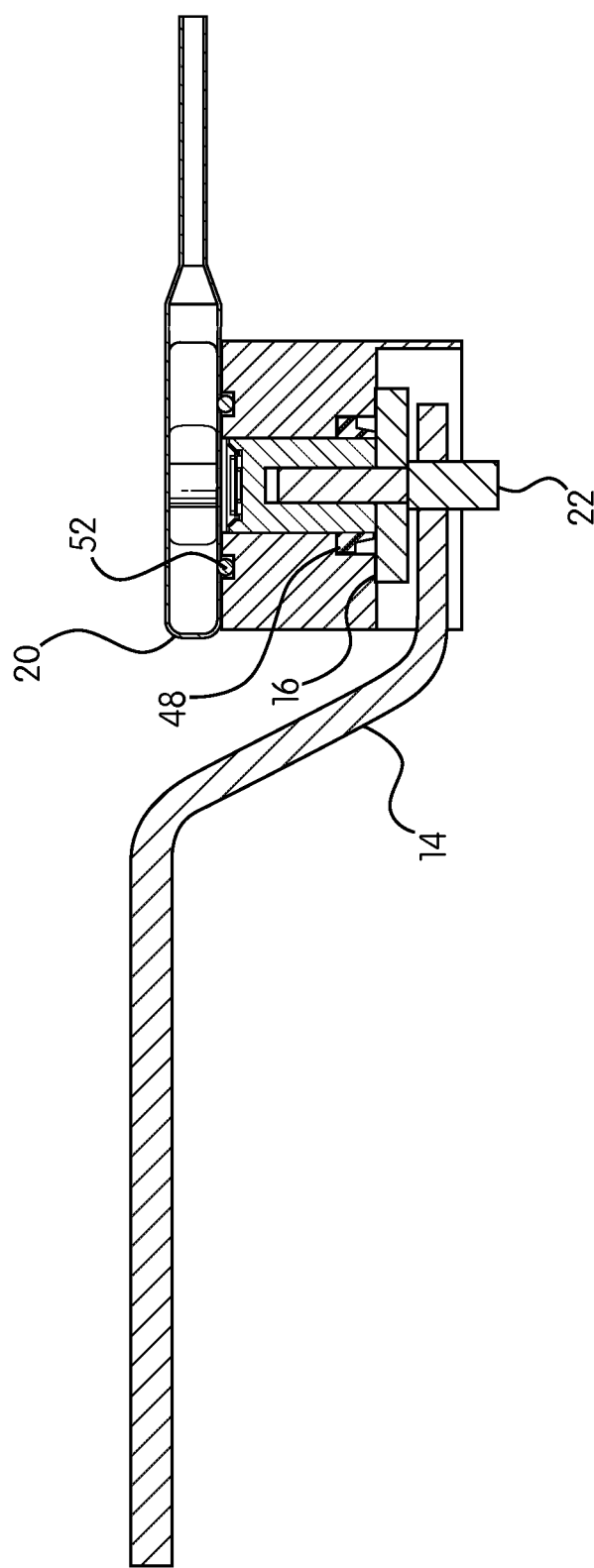
FIG. 5A is a lateral cross sectional view of the control sensor assembly of FIG. 2.
Figure 5B:
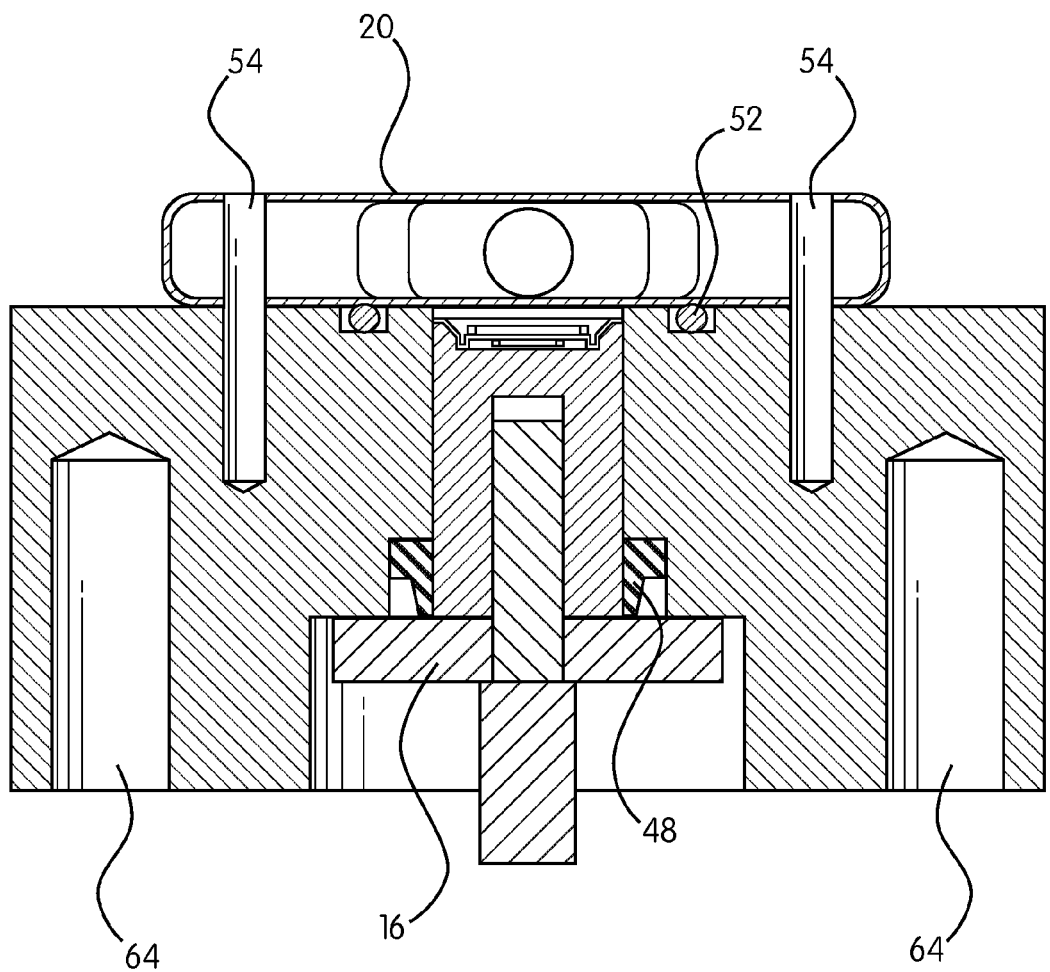
FIG. 5B is a coronal cross sectional view of the control sensor assembly of FIG. 2.

As shown in FIG. 6, the through hole 40 is configured to receive the second end of the bushing 16. As shown in FIGS. 5A and 5B, a seal 48, e.g., an oil seal, can be coupled around the stem 30 of the bushing 16. Specifically, the seal 48 is shaped to slidably fit around the cylindrical shape of the stem 30 of the bushing. When assembled to the mount, the seal 48 surrounds the stem 30 and sits adjacent the flange member 28. Thus, when the through hole 40 receives the bushing 16, the seal 48 seats within the counterbore 38 and prevents dirt and moisture from entering.

Additionally, the body is sized so as to have a longitudinal length of the through hole 40 to be greater than a longitudinal length of the stem 30 of the bushing 16 when the bushing is seated on the block. In other words, the bushing 16 is sized to have a longitudinal length such that the second end of the bushing is spaced from the second surface 44 when fully seated on the block. This way, the distal end of the bushing housing the magnet is spaced from the second surface thereby creating an air gap between the magnet and the sensor mounted to the second surface.

As shown in FIG. 7, the through hole 40 extends to the second surface 44 of the body. The sensor 20 is mounted onto the second surface 44. Preferably, the second surface 44 of the body comprises a recess 50 for at least partially receiving a complementary seal 52, e.g., an O-ring, (FIG. 4) for preventing dirt and moisture from entering and causing the control sensor assembly 12 to malfunction. When assembled, the seal 52 is positioned within the recess 50 as shown in FIGS. 5A and 5B. Additionally, the second surface 44 can include a pair of openings 54 for mounting the sensor 20 onto the mount 18 with suitable fasteners, e.g. pins, screws, bolts and the like.

As best shown in FIG. 6, the first and second spaced apart rotational stops 34, 36 extend from the first surface 42. Each rotational stop 34, 36 is positioned adjacent a lateral side of the counterbore 38 and the first rotational stop 34 includes an engaging surface 56 at an angle α of about 80 to 100 degrees relative to an engaging surface 58 of the second rotational stop 36. Of course, the rotational stops can alternatively be configured with an angle α more or less than 80 to 100 degrees or any angle between 80 and 100 degrees. The first rotational stop 34 and second rotational stop 36 are respectively spaced from each other about the first surface 42 of the mount 18.

The engaging surfaces 56, 58 of the respective first and second rotational stops 34, 36 define a space or range of motion the linkage 14 can pivot relative the mount 18. While the first and second rotational stops 34, 36 are referred to as rotational stops, they do not necessarily have to, but can, function as rotational stops. Instead, the first and second rotational stops 34, 36 can be guide surfaces collectively forming a one way guide slot to aid in properly assembling the linkage 14 to the mount 18 in a proper orientation. In other words, the first and second rotational stops 34, 36 collectively form a guide slot having a posterior back wall and a tapered opening about its anterior end. The guide slot is preferably configured to have a posterior end complementary in shape to receive the bushing 16 and an open anterior end through which the linkage 14 will reside in with enough play so that the inner side walls of the guide slot do not engage the linkage 14 during general operation.

The through hole 40 has a diameter slightly larger than the diameter of the stem 30 of the bushing 16 such that the bushing 16 is rotatable therein. As the bushing 16 rotates, the linkage 14 connected to the second end of the bushing 16 rotates. The linkage 14 has a limited range of motion as defined by its connections with the header height control system and is generally restricted to movement between the first and second rotational stops 34, 36.

As shown in FIG. 6, the mount 18 includes a curved section 60 extending between the first and second rotational stops 34, 36. The curved section 60 is sized and configured to receive the flange member 28 of the bushing 16. Specifically, it is shaped to be complementary to the shape of the flange member 28 of the bushing 16.

The rotational stops 34, 36 each have a mounting surface 62 substantially parallel to and spaced from the first surface 42 for engaging with the header and an opening 64 through which a fastener is passable for securing the mount 18 to the frame of a header. The mount 18 can be connected to the frame 10 with any suitable fasteners, e.g. pins, screws, bolts and the like. Alternatively, the mount 18 and the type of fasteners used can be adjusted to accommodate different headers, e.g., a corn header, draper, auger and the like.

When fully assembled and attached to the header, the mounting surface 62 of the rotational stops 34, 36 directly engages the frame 10 and the linkage 14 is positioned completely between the first and second rotational stops 34, 36. The proximal end of the linkage 14 is also positioned completely between the mounting surface 62 of the first surface 42.

Referring to FIGS. 6 and 7, the mount 18 further includes lateral side surfaces 66 extending substantially transverse to the first surface 42. Further, each of the first and second rotational stops 34, 36 include lateral side surfaces substantially parallel to and in line with respective lateral side surfaces 66 of the body.

Referring back to FIGS. 2-4, the sensor 20 is mounted to the mount 18 and spaced from the second end of the bushing 16. As discussed above, the second surface 44 of the body of the mount 18 contains a pair of openings 54 for mounting the sensor 20 onto the mount 18.

The sensor 20 is preferably a non-contact magnetic sensor, such as a Hall effect sensor. In order to properly function, the control sensor assembly 12 needs to properly maintain the air gap between the sensor 20 and the magnet 26. This air gap formed between the sensor 20 and the magnet 26, as a result of the bushing 16 having a longitudinal length sized less than a longitudinal length of the through hole 40, allows for proper functionality of the non-contact magnetic sensor. Unlike currently used sensors, the sensor 20 disclosed in the subject application does not have connected moving parts. Thus, the sensor 20 disclosed in the subject application does not result in wear that can result in damage to the sensor.

As shown in FIG. 2, the control sensor assembly 12 can be fully assembled prior to installation to the frame 10. As previously discussed, the through hole 40 on the mount 18 extends between the first surface 42 and the second surface 44. When fully assembled, the stem 30 of the bushing 16 is received within the through hole 40 about the first surface 42. The proximal end of the linkage 14 is connected to the flange member 28 of the bushing 16. The sensor 20 is mounted about the second surface 44 of the mount 18 such that the magnet 26 on the bushing 16 is spaced from the sensor 20 defining an air gap therebetween. When fully assembled, the control sensor assembly 12 is secured to the frame 10 of the header. As previously discussed, the rotational stops 34, 36 (or guide slot) assist in proper placement of the mount 18 when securing the mount onto the frame 10.

Figure 10:
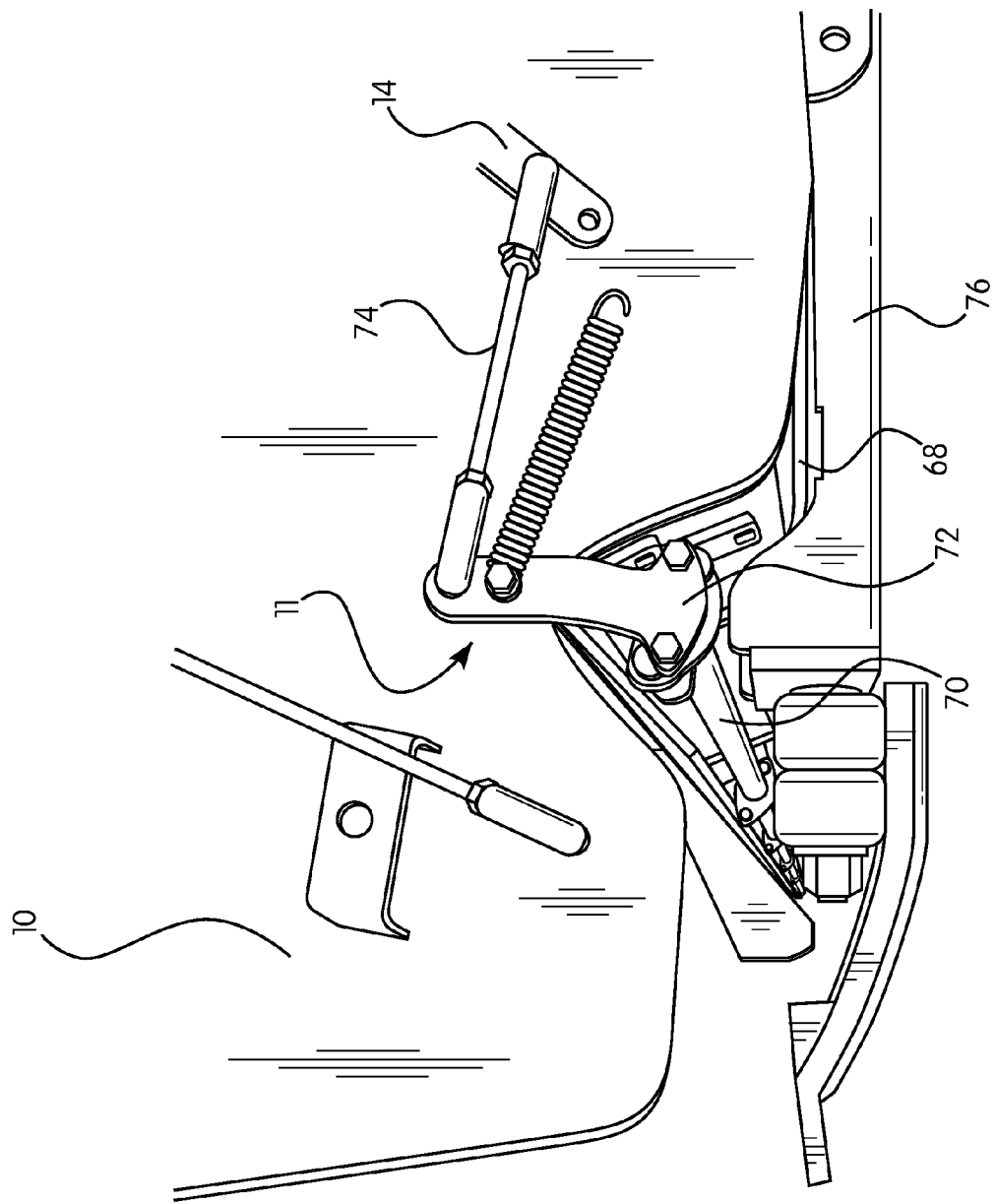
FIG. 10 is a side perspective view of a header of an agricultural harvester illustrating a header height control system applicable to the subject application with various components omitted for purposes of illustration.

Referring now to FIG. 10, there is shown a side view of a frame 10 of a header. When fully assembled and installed onto the frame 10, the control sensor assembly 12 (not shown) is connected to the header height control system 11. Specifically, the linkage 14 connects the control sensor assembly 12 to the header height control system 11. During harvesting operations, the header of the agricultural harvester travels along the field. As the header travels across the field, the cutter bar assembly 76 moves up and down causing the sensor arm 68 to move up and down. The sensor arm 68 is configured to rest on the cutter bar assembly 76. The sensor arm 68 is also welded to a sensor rod 70. Thus, when the sensor arm moves up or down, the sensor rod 70 rotates as well. The rotation of the sensor rod 70 causes a linking member 72 to rotate accordingly. Further, the linking member 72 is coupled to the linkage 14 of the control sensor assembly 12 by a connector 74. As a result, the rotational motion of the linking member causes the linkage 14 to rotate.

When the linkage 14 of the control sensor assembly 12 (FIG. 2) rotates, the bushing 16 and the magnet 26 rotate. Specifically, the magnet 26 is fixedly mounted to the bushing 16 allowing it to rotate as the bushing rotates. The rotation of the magnet results in the sensor 20 outputting a signal representative of a positional relationship between the header and the ground. Specifically, the sensor 20 configured as a Hall effect sensor produces a voltage representative of the positional relationship between the header and the ground.

In sum, when the cutter bar assembly 76 moves up or down, the header height control system 11 and its components discussed above cause movement of the linkage 14 and magnet 26 of the control sensor assembly 12. When the magnet 26 rotates, the sensor 20 produces an output voltage representative of the positional relationship between the header and the ground. The output voltage is transmitted to a computer of the agricultural harvester.

Although the frame 10 as shown in FIG. 1 is configured to have two sensor assemblies spaced along a side end of the frame, additional sensor assemblies can be placed at additional locations along the width of the header. For example, a draper header can have four control sensor assemblies, two for tilt and two for height. Additionally, an auger head can have four control sensor assemblies, while a corn header can have between two and four or more control sensor assemblies.

While the subject application has been described with reference to several aspects, it will be appreciated by those skilled in the art that various changes may be made and equivalents may be substituted for elements thereof without departing from the scope of the subject application. In addition, modifications may be made to adapt a particular situation or material to the teachings of the subject application without departing from the essential scope thereof. It is to be understood, therefore, that the subject application not be limited to the particular aspects disclosed, but it is intended to cover modifications within the spirit and scope of the subject application as defined by the appended claims.

What is claimed is:

1. A control sensor assembly for an agricultural harvester, comprising:
   a linkage for connection to a header height control system;
   a bushing that includes:
      a first end connected to the linkage, and
      a second end housing a magnet;
   a mount that includes:
      a body having a through hole extending from a first surface to a second surface opposite the first surface, the through hole sized for receiving the bushing, and
      a first rotational stop about the first surface and adjacent the through hole; and
   a sensor mounted to the second surface of the mount over the through hole and spaced from the second end of the bushing.

2. The control sensor assembly of claim 1, wherein the bushing is a flanged bushing.

3. The control sensor assembly of claim 1, further comprising a second rotational stop spaced from the first rotational stop about the first surface.

4. The control sensor assembly of claim 1, wherein the through hole includes a counterbore for receiving a seal.

5. The control sensor assembly of claim 1, wherein the second surface includes a recess for receiving a seal.

6. The control sensor assembly of claim 1, wherein the through hole has a longitudinal length greater than a longitudinal length of the bushing.

7. The control sensor assembly of claim 1, wherein the bushing is sized to have a longitudinal length such that the second end is spaced from the second surface.

8. The control sensor assembly of claim 1, wherein the linkage includes a shaft for connecting to the bushing.

9. The control sensor assembly of claim 1, wherein the bushing is rotatable within the through hole.

10. The control sensor assembly of claim 1, wherein the sensor is a non-contact magnetic sensor.

11. The control sensor assembly of claim 1, wherein the magnet is spaced from the sensor defining an air gap therebetween in the through hole.

12. A header of an agricultural harvester comprising:
    a frame;
    a linkage; and
    a control sensor assembly mounted to the frame, the control sensor assembly including:
       a bushing that includes:
          a first end connected to the linkage, and
          a second end housing a magnet;
       a mount that includes:
          a body having a through hole extending from a first surface to a second surface opposite the first surface, the through hole sized for receiving the bushing, and
          a first rotational stop about the first surface and adjacent the through hole, and
       a sensor mounted to the second surface of the mount over the through hole and spaced from the second end of the bushing.

13. The header of claim 12, wherein the linkage is connected to a header height control system.

14. The header of claim 12, wherein the control sensor assembly further comprises a second rotational stop spaced from the first rotational stop about the first surface.

15. The header of claim 12, wherein the through hole has a longitudinal length greater than a longitudinal length of the bushing.

16. The header of claim 12, wherein the linkage includes a fastener for connecting to the bushing.

17. The header of claim 12, wherein the bushing is rotatable within the through hole.

18. The header of claim 12, wherein the sensor is a non-contact magnetic sensor.

* * * * *